United States Patent
Esperandieu et al.

[11] Patent Number: 5,909,935
[45] Date of Patent: Jun. 8, 1999

[54] DEVICE FOR GUIDING, DRIVING, AND LOCKING A SLOT-IN MODULE OF ELECTRICAL OR ELECTRONIC EQUIPMENT IN A CABINET

[75] Inventors: Jean Guy Esperandieu, Vernegues; Robert Paul JoséSotiriou, Vitrolles, both of France

[73] Assignee: Eurocopter France, France

[21] Appl. No.: 08/769,076

[22] Filed: Dec. 18, 1996

[30] Foreign Application Priority Data

Dec. 19, 1995 [FR] France .................................. 95 15067

[51] Int. Cl.⁶ .................................................. H01R 13/62
[52] U.S. Cl. ............................ 312/333; 361/727; 74/109; 312/332.1; 220/3.8; 220/242
[58] Field of Search ..................... 361/727, 685, 361/684; 439/157, 372; 74/109; 312/223.1, 223.2, 333, 319.1, 331, 332.1, 334.27, 334.29, 334.31; 220/3.8, 242, 241

[56] References Cited

U.S. PATENT DOCUMENTS

| | | | |
|---|---|---|---|
| 3,217,211 | 11/1965 | Norden | 439/372 X |
| 3,977,749 | 8/1976 | Langenbech | 312/333 X |
| 4,152,038 | 5/1979 | Inouye et al. | 439/157 X |
| 4,501,455 | 2/1985 | Groseck | 312/333 X |
| 4,939,622 | 7/1990 | Weiss et al. | |
| 5,010,426 | 4/1991 | Krenz | |
| 5,077,722 | 12/1991 | Geist et al. | 439/157 X |
| 5,269,698 | 12/1993 | Singer | 439/157 |
| 5,299,944 | 4/1994 | Larabell et al. | 439/157 |
| 5,325,263 | 6/1994 | Singer et al. | 361/726 X |
| 5,518,412 | 5/1996 | Larabell | 439/157 |

FOREIGN PATENT DOCUMENTS

| | | |
|---|---|---|
| 0337856 | 10/1989 | European Pat. Off. |
| 1262383 | 5/1965 | Germany . |
| 4005500 | 8/1991 | Germany ............ 312/223.1 |
| 2015828 | 9/1979 | United Kingdom . |

*Primary Examiner*—Jose V. Chen
*Assistant Examiner*—Janet M. Wilkens
*Attorney, Agent, or Firm*—Henderson & Sturm

[57] ABSTRACT

A device for guiding, driving, and locking a slot-in module of electrical or electronic equipment in a cabinet, wherein the circuits of the slot-in module are connected to those of the cabinet by coupling the connectors of the slot-in module to those of the cabinet or a rack in the cabinet, wherein the cabinet is secured to a slide with which a slideway secured to the slot-in module can engage, wherein a system of pinions and of racks cause their relative travel under the action of a rotary control member in a manner such that, at the end of travel, an input pinion is automatically blocked by a spring that can be unblocked from the outside.

13 Claims, 7 Drawing Sheets

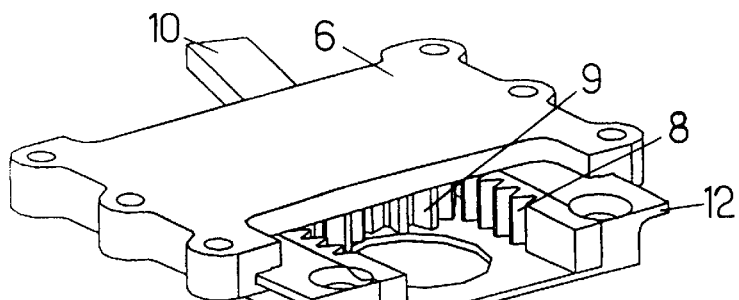
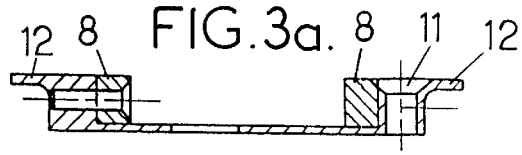
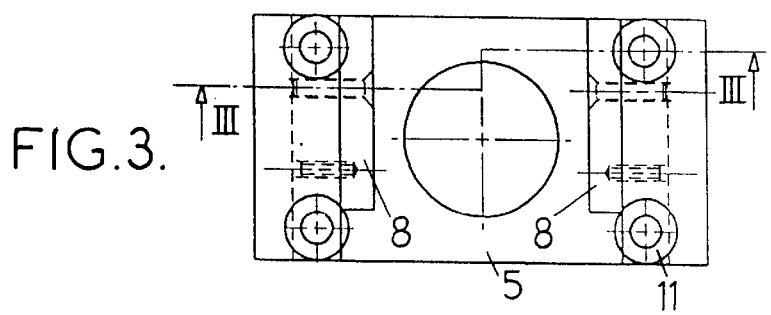
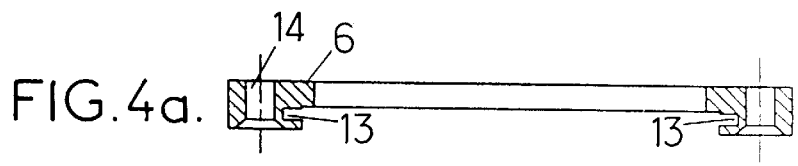
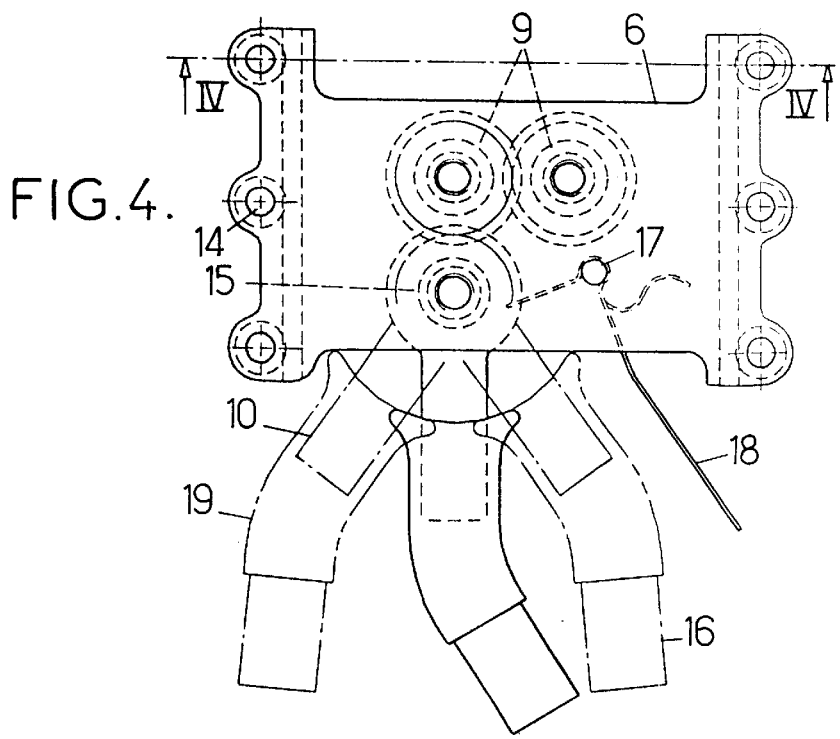

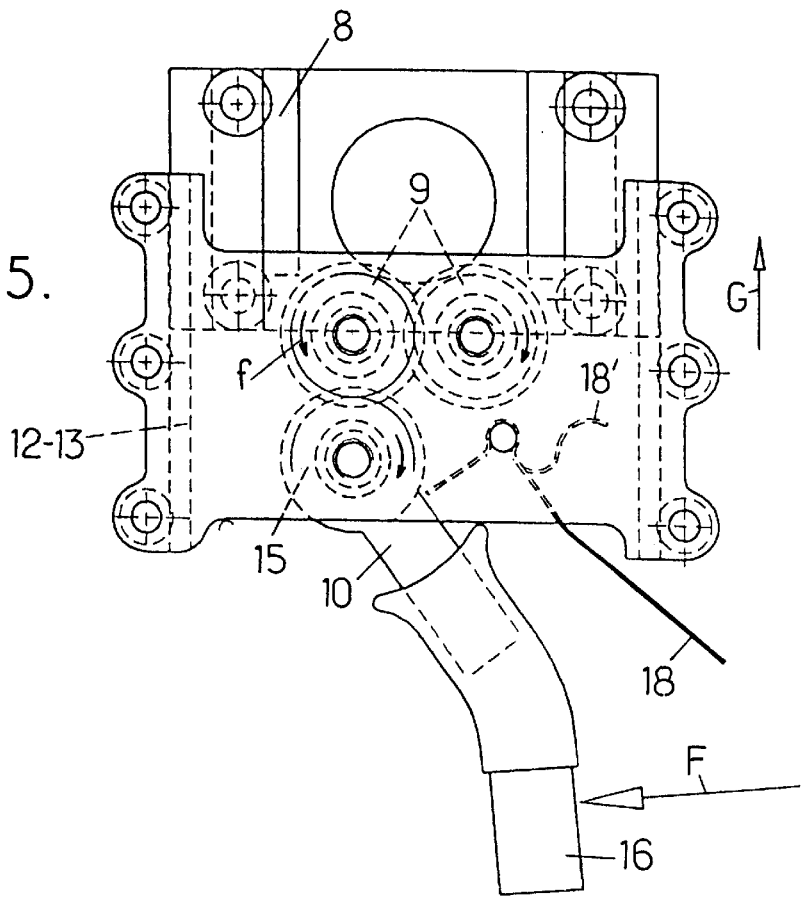
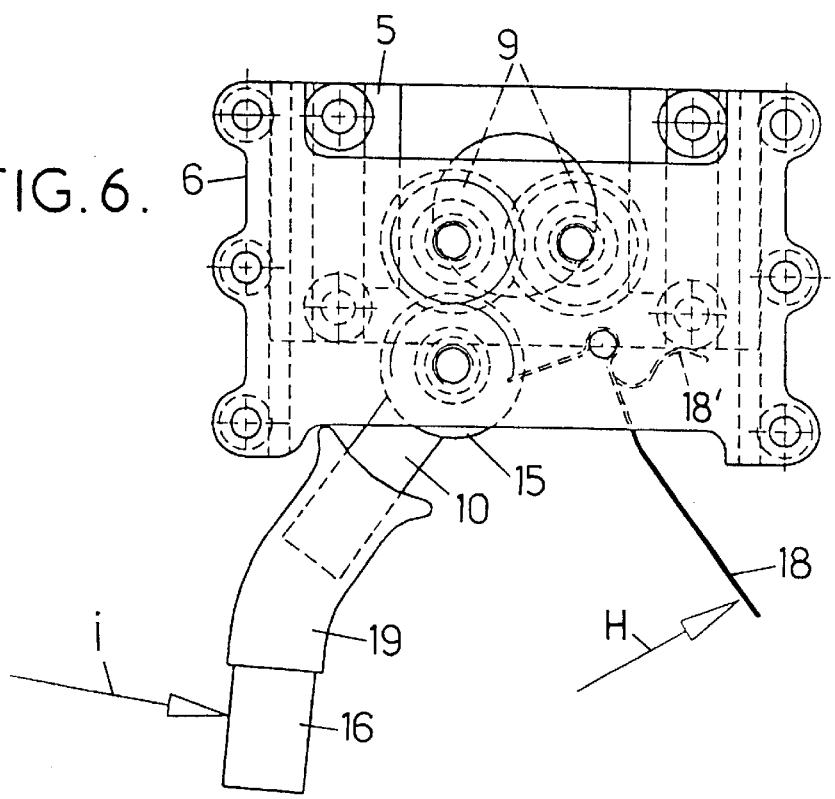

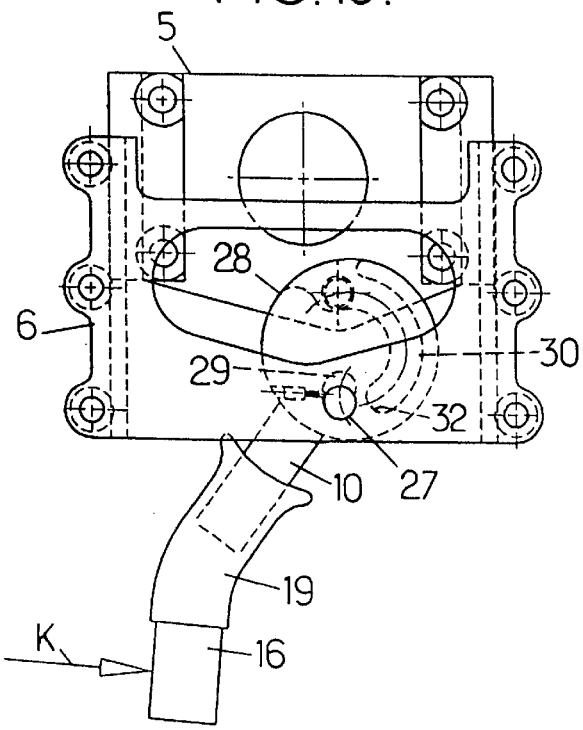
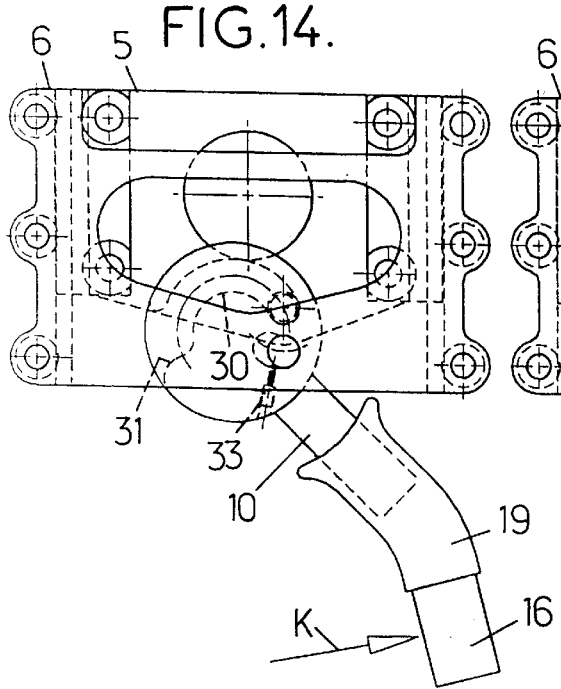
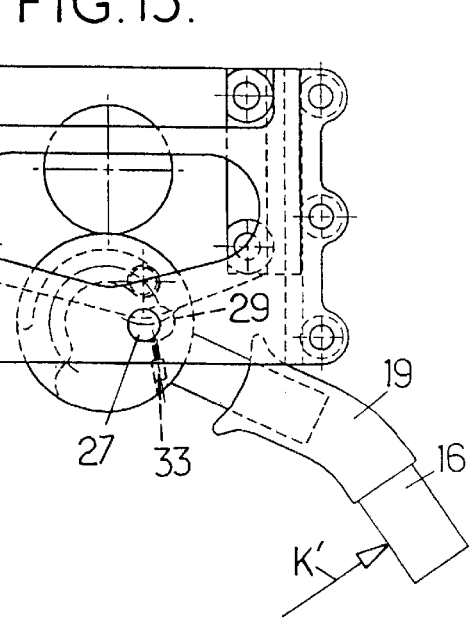

DEVICE FOR GUIDING, DRIVING, AND LOCKING A SLOT-IN MODULE OF ELECTRICAL OR ELECTRONIC EQUIPMENT IN A CABINET

CROSS-REFERENCE TO RELATED APPLICATIONS

Not Applicable

STATEMENT REGARDING FEDERALLY SPONSORED RESEARCH OR DEVELOPMENT

Not Applicable.

BACKGROUND OF THE INVENTION

FIELD OF THE INVENTION

The present invention relates to a device for guiding, driving, and locking a slot-in module of electrical or electronic equipment in a cabinet, it being necessary for the circuits of the slot-in module to be connected to those of the cabinet by coupling the connectors of the slot-in module to those of the cabinet (or rack).

BRIEF SUMMARY OF THE INVENTION

The object of the present invention is to simplify the existing devices described, for example, in document EP-A-0,337,856, while at the same time reducing their cost, while allowing precise control over the guidance and above all the insertion force with which the respective connectors of the slot-in module and of the cabinet are coupled. This is because these connectors need to be protected against any excessive force while at the same time friction caused by the seals and joints for isolating them from the electromagnetic environment needs to be overcome. Simple and effective means for locking the slot-in module in the cabinet when fitting is over need also to be provided, this being particularly important in the case of equipment on board aircraft (helicopter on-board computers, for example).

To this end, a device of the above-defined type includes, in a way known per se, guide elements of the sort having a slideway and a slide, one being fixed to the cabinet, the other to the slot-in module, for playing a part in the relative guiding of one on the other, and is characterized in that the slide and the slideway include interacting components which can be actuated from outside by a rotational movement of a control member that can be manoeuvred by a torque-limiting lever, for example a torque wrench, in such a way as to then be able to cause a movement of relative sliding of the said elements, and therefore of the slot-in module in the cabinet, when the slide is engaged in the slideway, as well as to halt this movement when the end-of-insertion and connectors-coupled position is reached, after release of the said wrench or lever, and in that means are provided for relative locking of the said interacting components, these then acting automatically in order to block the components of the slide with respect to those of the slideway and thus cause the slot-in module to be locked in the cabinet in the connected position.

This general principle of the invention can be employed in various ways, especially as far as the construction of the said interacting components and that of the said locking means are concerned.

For example, it is possible to envisage for the said interacting components to be of the type having a set of pinions and rack(s), the said rotary control member being coupled to an input pinion driving the said set and thus causing a movement of relative sliding between the said guide elements, the set of pinions secured to one of the said elements driving the rack or racks secured to the other element.

Advantageously, the said set of pinions is mounted in the said slideway, which is fixed to the said slot-in module, and the said slide, fixed to the cabinet, includes two lateral racks in which the said pinions can mesh as the slot-in module is being placed in the cabinet and, respectively, as the said slideway engages on the said slide.

For example, it may be possible for the said set of pinions of the slideway to include three pinions, namely an input pinion coupled to the said rotary control member and two lateral pinions meshing on the one hand with one another and, on the other hand and respectively, with the said lateral racks of the slide.

The locking means, too, may be produced in various ways.

For example, and in a particularly simple and reliable embodiment requiring only a minimum amount of additional equipment, it may be possible to provide, in the said slideway, a pivoting spring leaf, one end of which forms a lever which can be actuated from the outside and the other end of which may, at the end of insertion, press up between two teeth of the said input pinion, in order to block it and thus block the said set of pinions.

In another embodiment, when the set of pinions includes at least two lateral pinions meshing with one another, it will be possible to employ, in the said slideway, a blocking rod which can be unlocked from the outside by pushing the said torque-limiting lever and which at its internal end carries a jamming dog capable, when a thrust is exerted elastically in the opposite direction on the said rod, of jamming between the two said lateral pinions in order to prevent them from rotating in the direction allowing the said slideway to slide out of the said slide.

Thanks to this arrangement, it will easily be possible to contrive for the fitting of the said torque-limiting lever, in order to proceed with extracting the slot-in module, automatically to cause a thrust on the outer end of this rod and therefore the release of the two lateral pinions and the unlocking of the mechanism allowing relative sliding of the slideway on the slide.

In yet another embodiment, it will be possible to envisage for the said locking means to comprise a ball catch mounted so that it can rotate on the said slideway and capable of engaging via its end between two teeth of the said input pinion automatically as soon as the operation of inserting the slot-in module is over and of unlocking by pivoting in the opposite direction as soon as the said torque-limiting lever is put in place for extracting the slot-in module.

In an alternative form of the invention, the interacting components may be of a type other than pinions meshing in racks.

For example, it will be possible to use, on the said guide elements, interacting components (components replacing the pinions and racks) of the sort capable of causing the said elements to travel relative to one another, in one direction or in the other, using a ramp effect.

A device in accordance with the invention may therefore be further characterized in that one of the said guide elements of the slideway-and-slide sort bears an eccentric provided with an arc-shaped slot which opens at the periphery of the said eccentric, it being possible for this eccentric to be actuated from the outside by the rotational movement of the said control member, and in that the other guide element bears a peg which can be engaged via the open end of the said slot when one of the said guide elements is engaged on the other, after which rotation of the said eccentric will, through a ramp effect between the said slot and the said peg, cause one of the said elements to advance along the other until the said peg reaches the closed end of the said slot, and therefore until the slot-in module is fully inserted in the cabinet, while a rotation of the eccentric in the opposite direction will cause these two elements to be extracted one with respect to the other and therefore cause the said slot-in module to come out.

In this case it is advantageous to envisage for the said eccentric, which can be actuated by the said control member and therefore by the torque-limiting lever, to be borne by the said slideway, and for the said peg mounted on the slide to bear a rotating ring capable of limiting friction.

Such a device may be further characterized in that the said eccentric has an arched hole by means of which it is mounted so that it can pivot on its pin, in such a way that, at the end of travel, namely when the said peg hits the closed end of the arc-shaped slot of the eccentric, an additional rotation of the eccentric by means of the said control member causes the relative travel of the said pin from one end of the said arched hole to the other and consequently the blocking of the rotation of the eccentric, thus locking the said slot-in module in the position in which it is inserted into the said cabinet, it being possible for this blocking to be supplemented by an elastic catch blocking the pin of the eccentric in the said arched hole.

BRIEF DESCRIPTION OF THE SEVERAL VIEWS OF THE DRAWINGS

These embodiments of the invention will now be described by way of non-limiting examples with reference to the figures of the appended drawing, in which:

FIG. 2 represents in perspective the slideway/slide assembly of the guide elements;

FIGS. 3 and 4 are views in plan of the slide and of the slideway, respectively;

FIG. 3a is a view in transverse section on III—III of FIG. 3;

FIG. 4a is a view in transverse section on IV—IV of FIG. 4;

FIG. 5 is a view in plan showing the beginning of the introduction of the slideway of the slot-in module on the slide of the cabinet;

FIG. 6 is a view similar to the previous one at the end of an insertion, with locking means being employed;

FIG. 13 shows in plan the beginning of insertion of the slideway on the slide;

FIG. 14 is a view similar to that of FIG. 13 at the end of insertion; and

FIG. 15 is yet another view in plan similar to that of FIGS. 13 and 14, showing the locking of the eccentric.

DETAILED DESCRIPTION OF THE INVENTION

Figure 1:
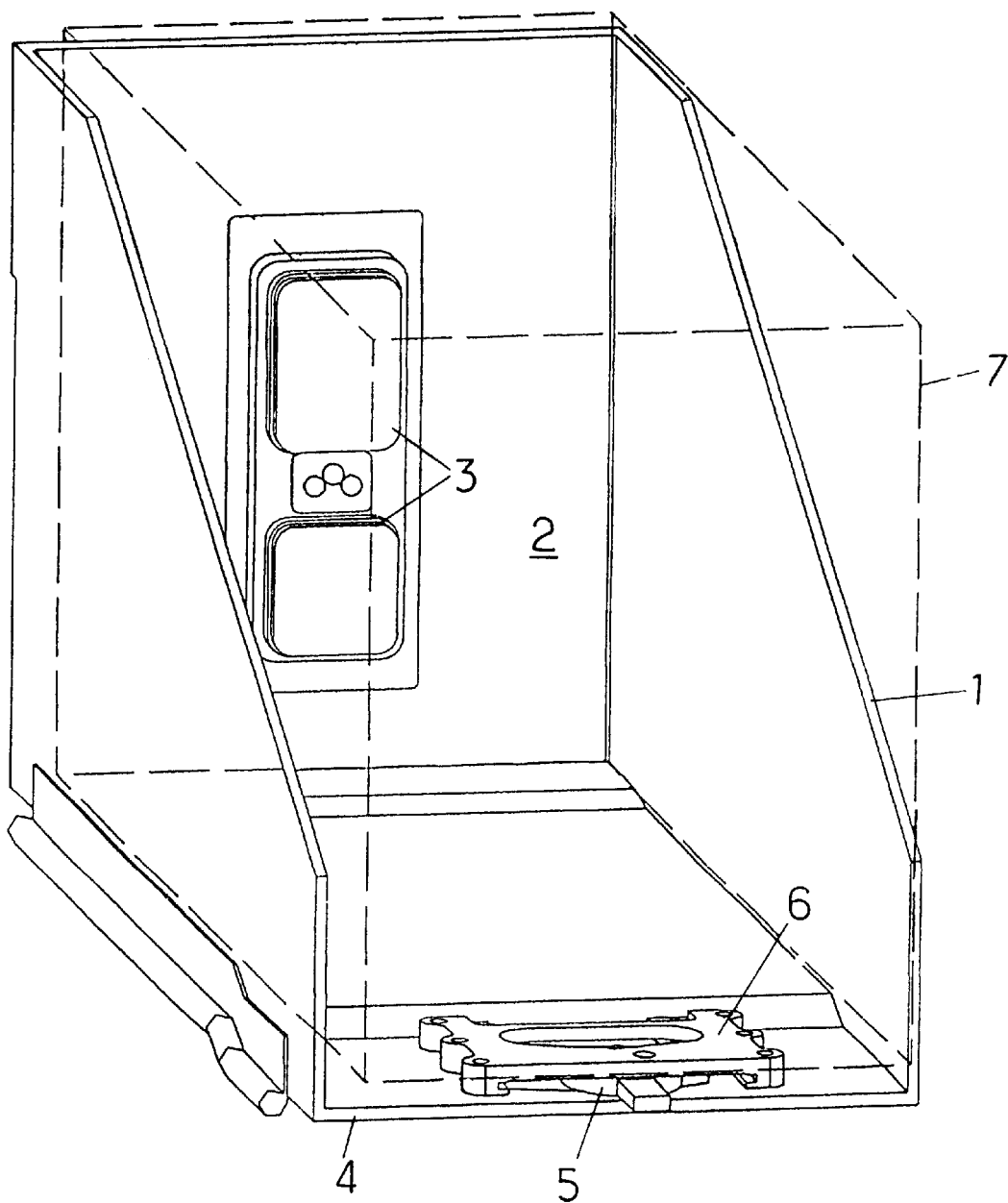
FIG. 1 represents diagrammatically and in perspective a compartment of a cabinet, rack or the like, into which it is desired, in a controlled way, to insert a slot-in rack or box of electrical, electronic or similar equipment.
Figure 7:
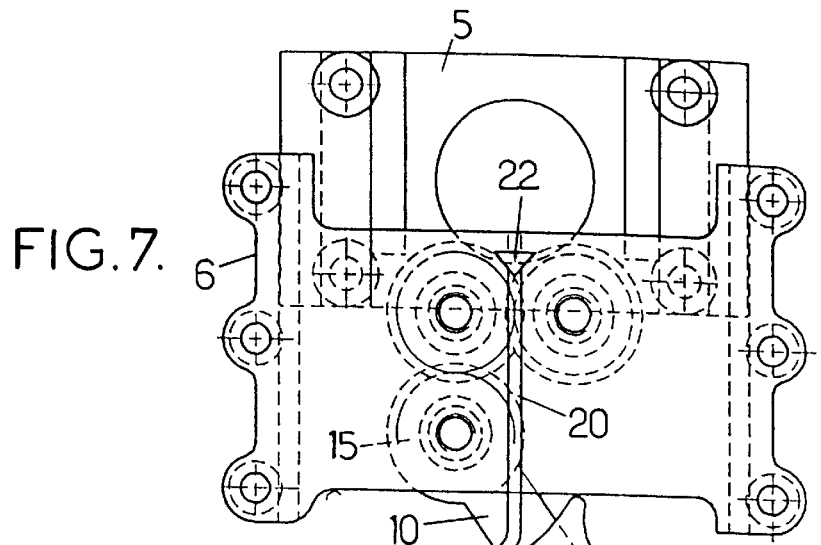
FIG. 7 shows in plan an alternative form of the locking means, in the during-insertion position, that is to say in the unlocked position.
Figure 7A:
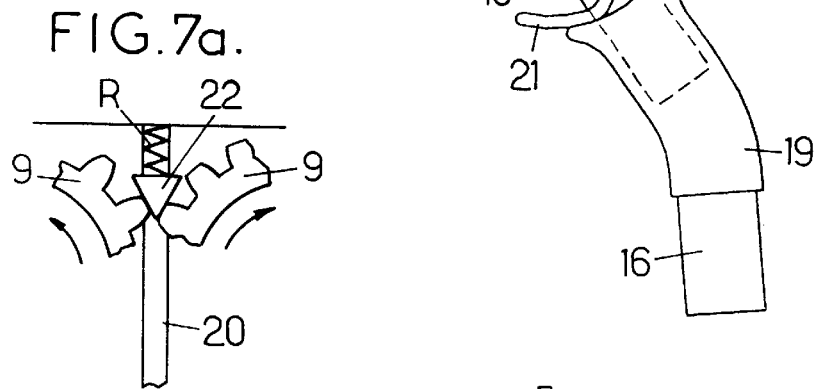
FIG. 7a shows a detail of the locking means in the course of insertion.
Figure 8:
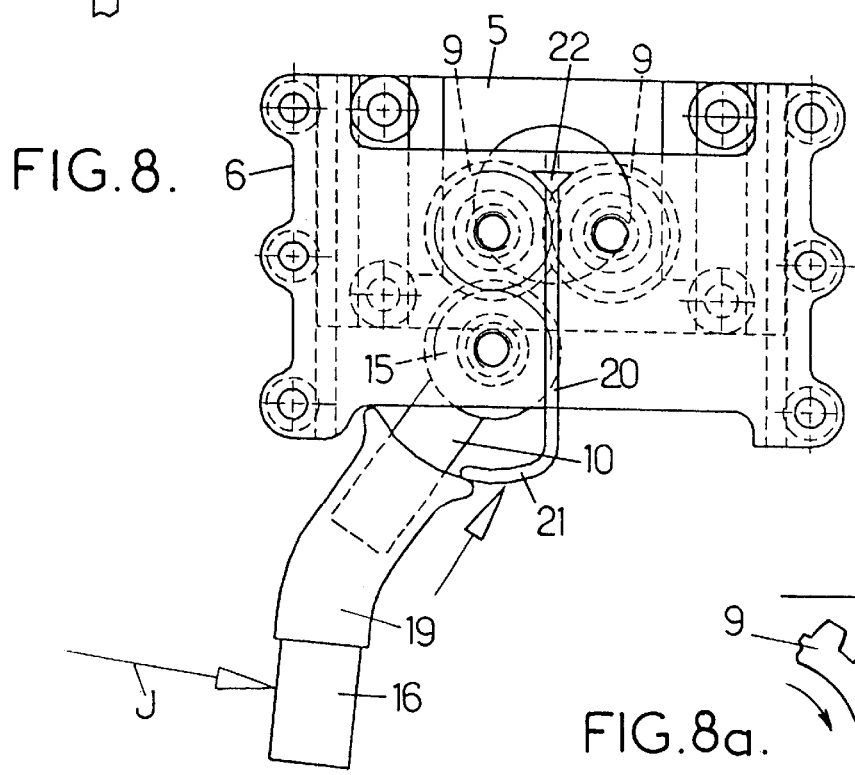
FIG. 8 is a view similar to that of FIG. 7, but in the end-of-insertion position, with the locking means blocked.
Figure 8A:
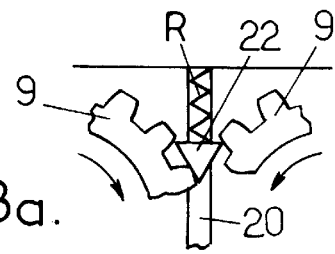
FIG. 8a shows a detail of the locking means in the blocked position.

In FIG. 1, the cabinet compartment is referenced as 1 and on its closed end 2 carries connection bases 3. On the support floor 4 of this compartment, and close to its edge, is attached a guide element 5 consisting of a slide with racks, over which another guide element 6 consisting of a slideway, with a set of gears, fixed to the box or slot-in module 7 is engaged. The next figures describe these two guide elements as well as the means allowing their relative locking at the end of travel when the slot-in module 7 is fully inserted into the cabinet and its connectors (not represented) are engaged in the connection bases 3 of the rack.

FIG. 2 shows internal and lateral racks 8 of the slide 5 and also reveals the lateral pinions 9 of the slideway, and the end of the control member 10, which members are more clearly visible in the other figures.

The slide 5 is pierced with four holes 11, allowing it to be fixed by screws to the support floor 4 of the cabinet, and includes two lateral flanges 12 serving as sliders for corresponding slots 13 in the slideway 6 which has six holes 14 for fixing it to the bottom of the equipment box 7.

It can be seen in FIG. 4 that the slideway bears the pins of a set of three pinions, namely an input pinion 15 on which the control member 10 is set, and the two lateral pinions 9 mentioned earlier, which are in mutual engagement (FIG. 4) and one of which is engaged with the input pinion 15. A torque wrench 16 constituting what was earlier called the torque-limiting lever may be engaged over the member 10. Finally, the slideway 6 bears a peg 17 over which is snap-fastened a leaf spring 18, the large end of which is accessible from the outside and the other, shorter end of which can press up between two teeth of the pinion 15.

That being the case, the slot-in module 7 is inserted into the cabinet by engaging the slideway 6 on the slide 5. By pivoting the torque wrench 16 in the direction of the arrow F (FIG. 5), the pinions 15 and 9 of the set of gears will pivot in the direction of the arrows f and the pinions 9, meshing in the lateral racks 8 of the slide 5, will drive the slideway in the direction of the arrow G, the slide being stationary, and this will continue until the end of insertion (FIG. 6). The torque wrench, by disengaging, will prevent excess force at the end of travel and this will protect the connectors on the slot-in module and on the cabinet. The fact that the torque wrench 16 is connected to the member 10 by means of an elbowed adapter 19 makes it possible, by turning it over, to limit the angle of excursion if necessary. In the final position of FIG. 6, end-of-travel locking will be provided automatically because one leg 18' of the spring 18 comes up against the end of the slide 5 by the pivoting of the spring 18 on its peg 17 and the snap-fitting of the inner end of this spring 18 between two teeth of the input pinion 15, this pressing of the spring thus blocking the rotation of the lateral pinions 9.

In order then to extract the slot-in module all that will be required will be to unlock the spring 18 by pushing its outer end in the direction of the arrow H then pushing the torque wrench 16 in the direction of the arrow I, which will make the pinions turn in the opposite direction from that of the arrows f and will make the slideway 6 slide in the opposite direction from that of the arrow G.

In the embodiment of FIGS. 7 and 8, 7a and 8a, the interacting components (racks and set of pinions) are of the same type as before, the alternative form relating only to the locking means. These here comprise a blocking rod 20 which can be manoeuvred from the outside thanks to a curved hook 21 bearing at its opposite, inner end, a jamming dog 22 which can jam between the two lateral pinions 9 (on the "pull-in" side) at the end of insertion (FIG. 8a) under the effect of a return spring R. Fitting the torque wrench 16 over the control member 10 in order to extract the slot-in module and shift the elbowed adapter 19 from left to right (arrow J in FIG. 8) will cause the hook 21 to be pushed forwards and therefore cause unjamming of the dog 22 and unlocking of the pinions 9 of the slideway 6, allowing them to pivot in the racks of the slide 5.

Figure 9:
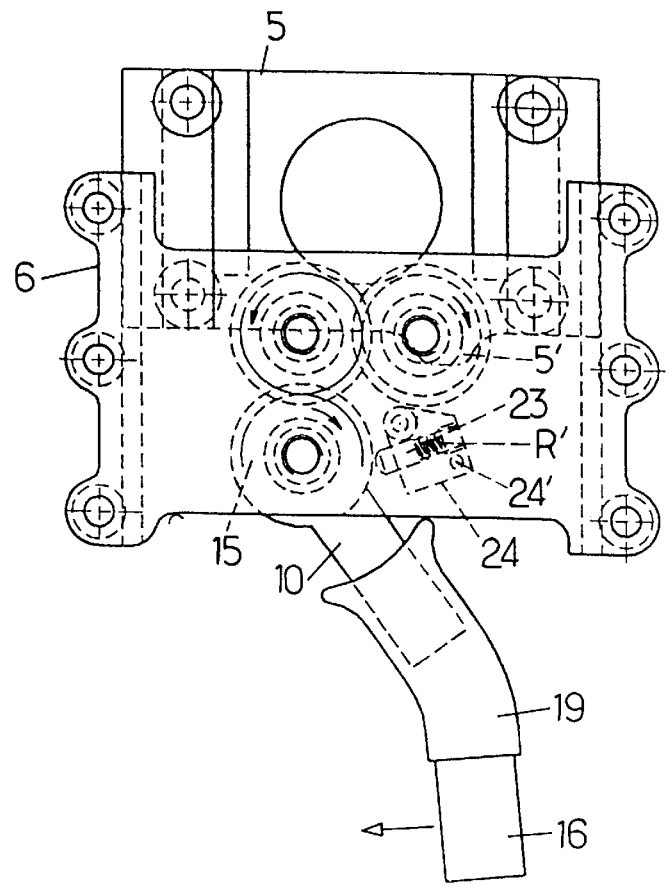
FIGS. 9 and 10 are views in plan, similar to those of FIGS. 7 and 8 respectively, showing still other locking means in the unlocked position (FIG. 9) and in the locked position (FIG. 10)
Figure 10:
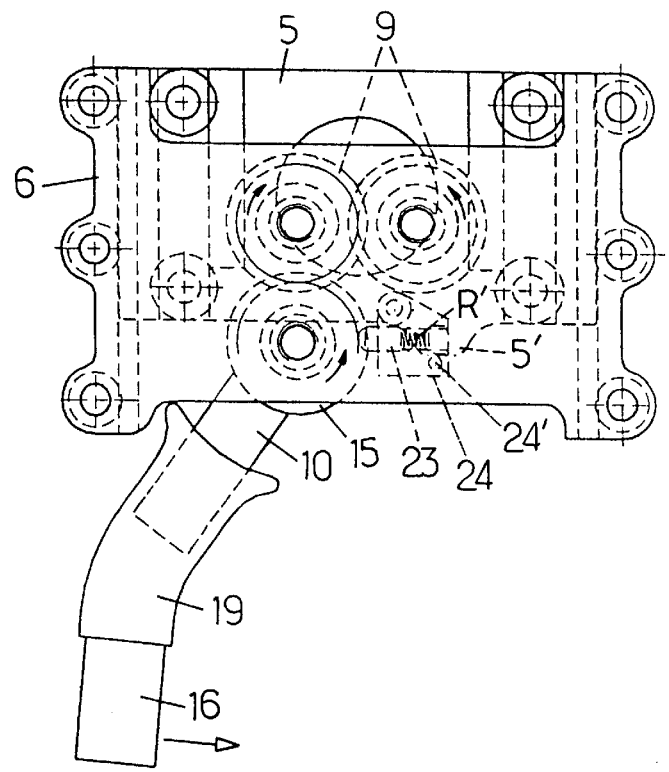
Figure 11:
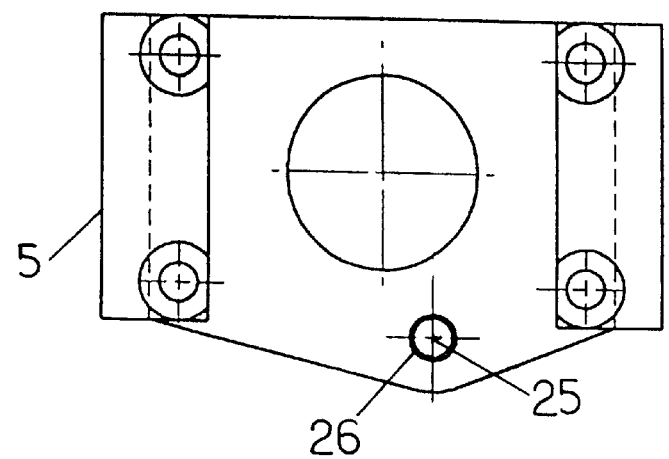
FIG. 11 shows in plan another type of slide, without racks.
Figure 12:
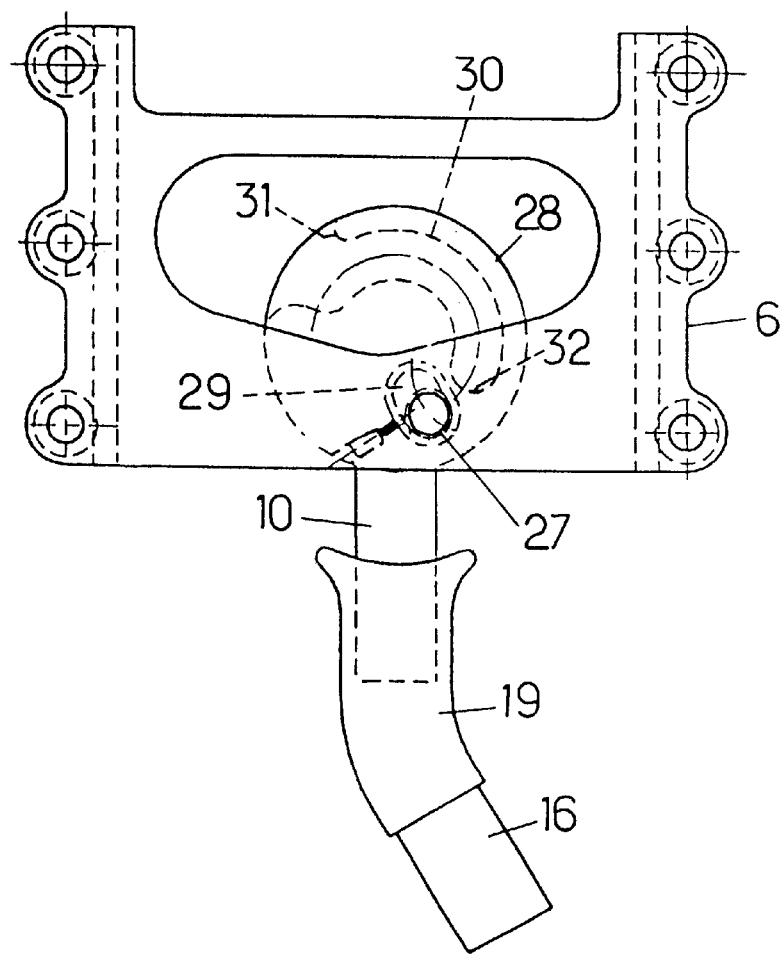
FIG. 12 shows in plan another type of slideway, of the type having an eccentric.

Represented in the embodiment of FIGS. 9 and 10 are still other locking means involving a ball catch 23 returned by a spring R' and mounted in a pivoting box 24 of the slideway 6. In this embodiment, the slide 5 at its front end carries a projection 5' which at the end of insertion (FIG. 10) serves as a stop for a post 24' of the box 24 and makes it pivot (clockwise), the end of the catch 23 then coming into engagement between two teeth of the input pinion 15 in order to block it. To extract the slot-in module, fitting the torque wrench causes, by rotation of the pinion 15 in the opposite direction, the slideway 6 to return forwards and the retraction of the catch 23 by return of the box 24 to the unlocked position of FIG. 9.

FIGS. 11 to 15 show the possibility of using other types of interacting components replacing the system with pinions and racks for bringing about the relative sliding, in one direction or the other, of the slide and of the slideway, it being possible for the slide to remain fixed to the floor 4 of the cabinet 1 and the slideway to the bottom of the slot-in module 7. For simplicity, the same references as before have been used to denote the slide, the slideway, the control member, the torque wrench and its adapter. Here we have adopted a ramp effect. For this, the slide 5 bears a peg 25 equipped, for limiting friction, with a rotating ring 26; the slide 5 has, moreover, the same external shape as before, or a similar shape, and the same is true of the slideway 6. For its part the latter bears a pivot pin 27 for an eccentric 28, which is mounted on this pin via an arched hole 29. Cut in the eccentric is an arc-shaped slot 30 opening onto its periphery via a mouth 31 and having a closed end 32 at its opposite end.

That being the case, insertion of the slideway 6 on the slide 5 is begun by orientating the control member 10 in such a way that the mouth 31 of the slot 30 faces the peg 25–26 and can fit over it (FIG. 13). Rotating the torque wrench 16 and therefore the member 10 in the direction of the arrow K will then cause the eccentric 28 to turn on its pin 27 in the anticlockwise direction, the right-hand end of the oblong hole 29 bearing against the pin 27, and the travel of the peg 25–26 in the slot 30 will progressively cause the slideway 6 to advance and then engage fully on the slide 5 (FIG. 14). The peg 25–26 then hits the closed end 32 of the slot 30. An additional rotation of the wrench (arrow K', FIG. 15) will shift the eccentric 28 slightly towards the right until the left-hand end of its oblong hole 29 hits the pin 27, which will prevent any rotation of the eccentric in the opposite direction and will therefore lock the slideway 6 on the slide 5. This locking may be supplemented by an elastic catch 33 which then blocks the pin 27 in this position. After unblocking, rotating the control member 10 in the opposite direction will make it possible conveniently to extract the slot-in module, as before.

What is claimed is:

1. In combination, a cabinet, a slot-in module for electrical or electronic equipment in said cabinet, and a device for guiding, driving, and locking the slot-in module of electrical or electronic equipment in THE cabinet, wherein circuits of the slot-in module are connected to circuits of the cabinet by coupling connectors of the slot-in module to connectors of equipment in the cabinet, said device comprising guide elements comprising a slideway and a slide fixed respectively to the cabinet and to the slot-in module for guiding one of said guide elements selected from the group consisting of the slideway and the slide over the another of said guide elements selected from the group consisting of the slideway and the slide, wherein said slide and said slideway comprise interacting components operably connected to a rotational movement control member for actuation, said control member comprising a torque-limiting lever and said components being actuated from outside the cabinet by said rotational movement control member in such a way as to cause a movement of relative sliding of said guide elements and the slot-in module in the cabinet when said slide is engaged in said slideway and to halt said movement when an end-of-insertion and a coupling connectors-coupled position is reached, after release of said torque-limiting lever; and locking means for relative locking of said interacting components acting automatically to block said interacting components of said slide with respect to said interacting components of said slideway and cause the slot-in module to be locked in the cabinet in a connected position, wherein said interacting components comprise a set of pinions comprising an input pinion and at least one rack, said rotational movement control member being coupled to said input pinion, said input pinion driving other pinions of said set of pinions and causing a movement of relative sliding between said guide elements, said set of pinions being secured to one of said guide elements selected from the group consisting of said slide and said slideway driving said at least one rack secured to another of said guide elements selected from the group consisting of said slide and said slideway.

2. A device according to claim 1, wherein said set of pinions is mounted in said slideway, which is fixed to said slot-in module, and wherein said slide, fixed to the cabinet, comprises two lateral racks in which said pinions can mesh as the slot-in module is being placed in the cabinet and, respectively, as said slideway engages on said slide.

3. A device according to claim 2, wherein said set of pinions of the slideway comprises said input pinion coupled to said rotational movement control member and two lateral pinions meshing with one another and with said lateral racks of said slide.

4. A device according to claim 3, wherein said locking means comprise, in the said slideway, a blocking rod adapted to be unlocked from outside the cabinet by pushing said torque-limiting lever, said blocking rod comprising an internal end comprising a jamming dog for jamming between said lateral pinions to prevent said lateral pinions from rotating in a direction allowing said slideway to slide out of said slide.

5. A device according to claim 3, wherein said locking means comprise, in said slideway, a pivoting spring leaf comprising one end forming a lever adapted to be actuated from outside the cabinet and another end for pressing between two teeth of said input pinion, in order to block said input pinion and said set of pinions.

6. A device according to claim 3, wherein said locking means comprise a ball catch rotatably mounted on said slideway, said ball catch comprising an end for engaging between two teeth of said input pinion automatically as soon as insertion of the slot-in module completed and for unlocking by pivoting in an opposite direction as soon as said torque-limiting lever is put in place for extracting the slot-in module.

7. A device according to claim 2, wherein said locking means comprise, in said slideway, a pivoting spring leaf comprising one end forming a lever adapted to be actuated from outside the cabinet and another end for pressing between two teeth of said input pinion, in order to block said input pinion and said set of pinions.

8. A device according to claim 2, wherein said locking means comprise a ball catch rotatably mounted on said slideway, said ball catch comprising an end for engaging between two teeth of said input pinion automatically as soon as the insertion of the slot-in module completed and for unlocking by pivoting in an opposite direction as soon as said torque-limiting lever is put in place for extracting the slot-in module.

9. A device according to claim 1, wherein said locking means comprise, in said slideway, a pivoting spring leaf comprising one end forming a lever adapted to be actuated from outside the cabinet and another end for pressing between two teeth of said input pinion, in order to block said input pinion and said set of pinions.

10. A device according to claim 1, wherein said locking means comprise a ball catch rotatably mounted on said slideway, said ball catch comprising an end for engaging between two teeth of said input pinion automatically as soon as insertion of the slot-in module is completed and for unlocking by pivoting in an opposite direction as soon as said torque-limiting lever is put in place for extracting the slot-in module.

11. In combination, a cabinet, a slot-in module for electrical or electronic equipment in said cabinet, and a device for guiding, driving, and locking the slot-in module of electrical or electronic equipment in the cabinet, wherein circuits of the slot-in module are connected to circuits of the cabinet by coupling connectors of the slot-in module to connectors of equipment in the cabinet, said device comprising guide elements comprising a slideway and a slide fixed respectively to the cabinet and to the slot-in module for guiding one of said guide elements selected from the group consisting of the slideway and the slide over the another of said guide elements selected from the group consisting of the slideway and the slide, wherein said slide and said slideway comprise interacting components operably connected to a rotational movement control member for actuation from outside the cabinet by said rotational movement control member in such a way as to cause a movement of relative sliding of said guide elements and the slot-in module in the cabinet when said slide is engaged in said slideway and to halt said movement when an end-of-insertion and a coupling connectors-coupled position is reached, after release of said rotational movement control member; and locking means for relative locking of said interacting components acting automatically to block said interacting components of said slide with respect to said interacting components of said slideway and cause the slot-in module to be locked in the cabinet in a connected position, wherein said interacting components employ a ramp effect, and wherein one of said guide elements selected from the group consisting of said slideway and the slide comprises an eccentric comprising an arc-shaped slot which opens at a periphery of said eccentric, said eccentric being actuated from outside the cabinet by rotational movement of said rotational movement control member, and another of said guide elements comprising a peg for engaging an open end of said arc-shaped slot when one of said guide elements is engaged on another of said guide elements after which rotation of the said eccentric will, through said ramp effect between said slot and said peg, cause one of said guide elements to advance along another of said guide elements until said peg reaches a closed end of said slot, and until said slot-in module is fully inserted in the cabinet, while a rotation of said eccentric in an opposite direction will cause said guide elements to be extracted, one with respect to another of said guide elements, and cause the slot-in module to be extracted.

12. A device according to claim 11, wherein said eccentric, which is adapted to be actuated by said rotational movement control member is borne by said slideway, and wherein said pet mounted on said slide comprises a rotating ring for limiting friction.

13. A device according to claim 11, wherein said eccentric comprises an arched hole for pivotally mounting said eccentric on a pin, in such a way that, at end of travel when said peg hits said closed end of said arc-shaped slot of said eccentric, an additional rotation of said eccentric by means of said rotational movement control member causes relative travel of said pin from one end of said arched hole to another end of said arched hole to block rotation of said eccentric and lock the slot-in module in a position in which the slot-in module is inserted into the cabinet, and an elastic catch for blocking said pin of said eccentric in said arched hole.

* * * * *